United States Patent
Park et al.

(10) Patent No.: US 9,318,660 B2
(45) Date of Patent: Apr. 19, 2016

(54) METHODS OF GROWING NITRIDE SEMICONDUCTORS AND METHODS OF MANUFACTURING NITRIDE SEMICONDUCTOR SUBSTRATES

(71) Applicant: Samsung Electronics Co., Ltd., Suwon-Si, Gyeonggi-Do (KR)

(72) Inventors: Sung-soo Park, Seongnam-si (KR); Moon-sang Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/590,548

(22) Filed: Jan. 6, 2015

(65) Prior Publication Data

US 2015/0115280 A1    Apr. 30, 2015

Related U.S. Application Data

(60) Division of application No. 13/599,602, filed on Aug. 30, 2012, now Pat. No. 8,962,458, which is a continuation of application No. 12/929,856, filed on Feb. 22, 2011, now Pat. No. 8,357,594.

(30) Foreign Application Priority Data

| Feb. 19, 2010 | (KR) | ......................... 10-2010-0015247 |
| Aug. 24, 2010 | (KR) | ......................... 10-2010-0082085 |

(51) Int. Cl.
*H01L 21/36* (2006.01)
*H01L 33/32* (2010.01)
(Continued)

(52) U.S. Cl.
CPC .............. *H01L 33/32* (2013.01); *C30B 25/183* (2013.01); *C30B 29/403* (2013.01); *H01L 21/0242* (2013.01); *H01L 21/0254* (2013.01); *H01L 21/0262* (2013.01); *H01L 21/02458* (2013.01); *H01L 21/02513* (2013.01); *H01L 21/02645* (2013.01); *H01L 33/12* (2013.01); *H01L 33/24* (2013.01)

(58) Field of Classification Search
CPC .................................................. H01L 21/02458
See application file for complete search history.

(56) References Cited

U.S. PATENT DOCUMENTS

| 6,528,394 B1 | 3/2003 | Lee |
| 6,664,560 B2 | 12/2003 | Emerson et al. |

(Continued)

FOREIGN PATENT DOCUMENTS

| CN | 1240304 A | 1/2000 |
| JP | 2006-261476 A | 9/2006 |

(Continued)

OTHER PUBLICATIONS

Japanese Office Action dated May 27, 2014 for corresponding Japanese application No. 2011-033451.

(Continued)

*Primary Examiner* — Alexander Ghyka
(74) *Attorney, Agent, or Firm* — Harness, Dickey & Pierce, P.L.C.

(57) ABSTRACT

Methods of growing nitride semiconductor layers including forming nitride semiconductor dots on a substrate and growing a nitride semiconductor layer on the nitride semiconductor dots. The nitride semiconductor layer may be separated from the substrate to be used as a nitride semiconductor substrate.

14 Claims, 5 Drawing Sheets

(51) Int. Cl.

| | |
|---|---|
| *C30B 25/18* | (2006.01) |
| *C30B 29/40* | (2006.01) |
| *H01L 21/02* | (2006.01) |
| *H01L 33/12* | (2010.01) |
| *H01L 33/24* | (2010.01) |

(56) References Cited

U.S. PATENT DOCUMENTS

| | | |
|---|---|---|
| 6,720,196 B2 | 4/2004 | Kunisato et al. |
| 6,734,033 B2 | 5/2004 | Emerson et al. |
| 8,357,594 B2 | 1/2013 | Park et al. |
| 2002/0017650 A1 | 2/2002 | Nikolaev et al. |
| 2003/0020061 A1 | 1/2003 | Emerson et al. |
| 2003/0209705 A1 | 11/2003 | Emerson et al. |
| 2005/0236633 A1 | 10/2005 | Emerson |
| 2007/0072320 A1 | 3/2007 | Frayssinet et al. |
| 2007/0093037 A1 | 4/2007 | Zhu et al. |
| 2007/0141823 A1 | 6/2007 | Preble et al. |
| 2007/0248132 A1 | 10/2007 | Kikuchi et al. |
| 2008/0135855 A1 | 6/2008 | Emerson |
| 2009/0098714 A1 | 4/2009 | Chang et al. |
| 2009/0315150 A1 | 12/2009 | Hirota et al. |

FOREIGN PATENT DOCUMENTS

| | | |
|---|---|---|
| JP | 2009-007241 A | 1/2009 |
| JP | 2009-096655 A | 5/2009 |
| JP | 2009-522822 A | 6/2009 |
| KR | 10-0304664 | 7/2001 |
| KR | 2007-00746161 A | 5/2007 |
| KR | 20090016051 A | 2/2009 |
| WO | WO-2006/025407 A1 | 3/2006 |
| WO | WO-2009/015350 A1 | 1/2009 |

OTHER PUBLICATIONS

European Search Report dated May 13, 2011 issued in corresponding European Application No. 11155069.5.
H. Lahreche et al., "Growth of high-quality GaN by low-pressure metal-organic vapour phase epitaxy (LP-MOVPE) from 3D islands and lateral overgrowth", *J. Crystal Growth*, vol. 205, pp. 245-252 (Sep. 1, 1999).
Hsin-Hsiung Huang et al., "Strain-reduced GaN thick-film grown by hydride vapor phase epitaxy utilizing dot air-bridged structure", *J. Crystal Growth*, vol. 311, pp. 3029-3032 (May 1, 2009).
Pierre Gibart et al., "Metal organic vapour phase epitaxy of GaN and lateral overgrowth", *Reports on Progress in Physics*, Inst. of Physics Publishing, Bristol, GB, vol. 67, No. 5, pp. 667-715 (May 1, 2004).
Chinese Office Action dated Mar. 11, 2015 in corresponding Chinese Patent Application No. 201110041543.4.
Japanese Patent Application No. 2011-033451 mailed Mar. 24, 2015, and English translation thereof.
Tang, T.-Y., "Coalescence overgrowth of GaN nanocolumns on sapphire with patterned metal organic vapor phase epitaxy", Journal of Applied Physics, Jan. 16, 2009, vol. 105, No. 2, pp. 023501-1-023501-8.
European Examination Report dated May 8, 2015 issued in corresponding European Application No. 11 155 069.5.
Korean Office Action dated Nov. 4, 2015 issued in corresponding Korean Patent Application No. 10-2010-0082085 (English translation provided).

METHODS OF GROWING NITRIDE SEMICONDUCTORS AND METHODS OF MANUFACTURING NITRIDE SEMICONDUCTOR SUBSTRATES

CROSS-REFERENCE TO RELATED APPLICATIONS

This application is a divisional application of U.S. application Ser. No. 13/599,602, filed Aug. 30, 2012, which claims priority under 35 U.S.C. §120 to U.S. application Ser. No. 12/929,856, filed Feb. 22, 2011, which claims priority under 35 U.S.C. 119 to Korean Patent Application No. 10-2010-0015247, filed on Feb. 19, 2010, and Korean Patent Application No. 10-2010-0082085, filed on Aug. 24, 2010 in the Korean Intellectual Property Office (KIPO), the entire contents of each of which are incorporated herein by reference.

BACKGROUND

1. Field

Example embodiments relate to methods of growing nitride semiconductor layers and nitride semiconductor substrates manufactured using the methods.

2. Description of the Related Art

Electronic industries using nitride semiconductors have been considered as suitable fields for developing and growing green industries. In one example, Gallium nitride (GaN) is widely used as a nitride semiconductor in fabrication of blue light-emitting diodes. Blue light-emitting diodes are a core component of high-power electronic devices. High-power electronic devices commonly include red, green, and/or blue light-emitting diodes (LED) as core components. A blue LED fabricated with GaN has improved brightness, lifespan, and internal quantum efficiency compared to the conventional blue light-emitting device fabricated with Zinc selenide (ZnSe) due to the better physical and chemical properties of the GaN. The GaN has a direct transition bandgap structure and the bandgap is adjustable from about 1.9 to about 6.2 eV by using an alloy such as Indium or Aluminum. Therefore, GaN may be used for light devices. In addition, GaN has a relatively high breakdown voltage and is more stable at higher temperatures and may be used in various fields such as higher power devices and higher temperature electronic devices. For example, GaN may be applied in large electronic signs using full-color displays, traffic lights, light sources of optical recording media, high power transistors for vehicle engines and the like. A LED fabricated using a GaN substrate has less defects, the same or substantially the same refractive index in both the GaN substrate and the device layer, and a thermal conductivity that is about four-times greater than that of sapphire ($Al_2O_3$). Thus, GaN is used frequently in fabricating higher power LEDs.

SUMMARY

Provided are methods of growing semiconductor layers and methods of manufacturing semiconductor substrates. Cracks and/or dislocations may be generated while growing a semiconductor layer due to the strain on interfaces caused by the difference between lattice constants and/or thermal expansion coefficients of the semiconductor layer and a substrate. A nitride semiconductor layer grown according to example embodiments may be crack free and/or a crack free thickness of the nitride semiconductor layer may be increased. A dislocation density of the semiconductor layer may be reduced.

According to example embodiments, a method of growing a nitride semiconductor layer includes preparing a substrate, forming nitride semiconductor dots on the substrate and growing a nitride semiconductor layer on the nitride semiconductor dots.

The method may further include forming a stress relaxation layer in which the nitride semiconductor dots are connected to each other during growing of the nitride semiconductor layer. The nitride semiconductor layer may have a thickness that is equal to or greater than a thickness of the stress relaxation layer. A thickness of the stress relaxation layer may be about 1 μm to 100 μm. The nitride semiconductor layer may be formed by using a halide vapor phase epitaxy (HVPE) method. The nitride semiconductor dots may be formed in-situ when the nitride semiconductor layer is grown on the substrate by using the HVPE method. The nitride semiconductor dots may be arranged in a direction. A thickness of the grown nitride semiconductor layer may depend on an average size of the nitride semiconductor dots.

The nitride semiconductor dots may mostly have an average size of about 0.4 μm or greater. The nitride semiconductor dots may mostly have an average size of about 0.4 μm to about 0.8 μm. Here, the thickness of the grown nitride semiconductor layer may be about 100 μm to about 1000 μm. The nitride semiconductor dots may mostly have an average size of about 0.4 μm or less. Here, the thickness of the grown nitride semiconductor layer may be about 10 μm or less. The nitride semiconductor layer and the nitride semiconductor dots may include gallium nitride (GaN). The nitride semiconductor dots may have hexagonal shapes. The substrate may be a sapphire substrate. The nitride semiconductor layer may be separated from the substrate by a laser liftoff method to be used as a nitride semiconductor substrate. The nitride semiconductor substrate may be a GaN substrate. The nitride semiconductor dots may be on a surface of the nitride semiconductor layer.

According to other example embodiments, a nitride semiconductor substrate includes nitride semiconductor dots and a nitride semiconductor layer grown on the nitride semiconductor dots.

The nitride semiconductor substrate may further include a stress relaxation layer in which the nitride semiconductor dots are connected to each other during growing of the nitride semiconductor layer. The nitride semiconductor layer may have a thickness that is equal to or greater than a thickness of the stress relaxation layer. A thickness of the stress relaxation layer may be about 1 μm to 100 μm. The nitride semiconductor dots may be arranged in a direction on a surface of the nitride semiconductor layer. The nitride semiconductor dots may mostly have an average size of about 0.4 μm to about 0.8 μm. The thickness of the grown nitride semiconductor layer may be about 100 μm to about 1000 μm. The nitride semiconductor dots may mostly have an average size of about 0.4 μm or less. The thickness of the grown nitride semiconductor layer may be about 10 μm. The semiconductor dots may have hexagonal shape on a surface of the nitride semiconductor layer.

According to still other example embodiments, a method of growing a nitride semiconductor layer includes forming a plurality of nitride semiconductor dots on a substrate and growing a nitride semiconductor layer on the nitride semiconductor dots. According to yet other example embodiments, a method of manufacturing a material layer includes growing a plurality of cores on a first layer including a first material, growing a second layer including at least one second material from the cores and growing a third layer including at least one third material on the second layer, the first material different from the third material. According to further example embodiments, a nitride semiconductor substrate includes a plurality of nitride semiconductor dots and a nitride semiconductor layer on the nitride semiconductor dots. According to still further example embodiments, semiconductor substrate includes a frontside substrate layer and a backside substrate layer including a plurality of material dots.

BRIEF DESCRIPTION OF THE DRAWINGS

Example embodiments will be more clearly understood from the following brief description taken in conjunction with the accompanying drawings. FIGS. 1-6 represent non-limiting, example embodiments as described herein.

FIG. 1 is a cross-sectional diagram illustrating methods of growing a semiconductor layer on a substrate according to example embodiments;

FIG. 2 is a cross-sectional diagram of a semiconductor layer separated from a substrate;

FIG. 3 is a perspective diagram of semiconductor dots formed on a substrate;

FIG. 5 is an optical microscope image showing a stress relaxation layer formed between GaN dots used as cores on a sapphire substrate, and a GaN layer on the GaN dots and the stress buffer layer; and FIG. 6 is an optical image showing thick GaN/sapphire layers grown according to example embodiments with diameters of about 3 inches and about 4 inches.

Figure 1:
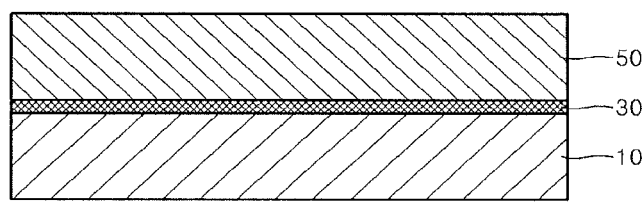

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Various example embodiments will now be described more fully with reference to the accompanying drawings in which some example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions may be exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Gallium nitride (GaN), as a nitride semiconductor, may be a relatively wide bandgap material with an energy bandgap of about 3.39 eV. Gallium nitride may be a direct transition type material and may be suitable for short-wavelength light-emitting devices.

Growth of a single crystal of GaN in a liquid phase generally requires a relatively high temperature of at least about 1500° C. and a nitrogen atmosphere of about 20,000 atm to obtain a relatively high nitrogen vapor pressure at the melting point. It may be relatively difficult to mass-produce single crystals of GaN by using a liquid phase growth method. The currently available size of the single crystal GaN by the growth method in the liquid phase is about 100 mm$^2$, which may not be large enough to be used in fabrication of light-emitting devices. A GaN thin film may also be grown by vapor deposition methods employing a heterogeneous substrate. Such vapor deposition methods may include, for example, a metal organic chemical vapor deposition (MOCVD) method and a hydride or halide vapor phase epitaxy (HVPE) method. Sapphire may be used for the heterogeneous substrate in fabricating the GaN thin film because sapphire may be relatively stable at relatively high temperature and also may be relatively inexpensive.

Growing higher quality GaN films on a sapphire substrate may be relatively difficult because of a difference of about 16% in lattice constants and a difference of about 25% in coefficients of thermal expansion between sapphire substrates and GaN thin films. Due to these differences, there may be a strain on the interface between the sapphire substrate and the GaN thin film. The strain may cause lattice defects in the GaN crystal and/or cracks in the interface, and may result in a reduction of the lifespan of a device fabricated on the GaN thin film. The light-emitting efficiency of a light-emitting diode (LED) fabricated on the sapphire substrate may be limited because of a difference between refractive indexes of the sapphire substrate and the GaN thin film, as well as, the stress induced defects in the GaN crystal. A substrate with the same or similar characteristics to a GaN thin film, such as a GaN substrate, and fabricating a device on the nitride semiconductor substrate (GaN substrate) by a homoepitaxy process, may reduce the occurrence of these issues.

One or more example embodiments may provide a method of growing a nitride semiconductor layer. According to example embodiments, a nitride semiconductor layer may be grown on a substrate with few and/or decreased cracks, and/or without cracks by reducing and/or eliminating the differences between the lattice constants and/or the thermal expansion coefficients of the substrate and the nitride semiconductor layer formed by, for example, an HVPE method. A substrate may be prepared to grow the nitride semiconductor layer. Nitride semiconductor dots may be formed on the substrate. The nitride semiconductor dots may be arranged in a first direction, and may reduce the cracks generated due to the differences between the lattice constants and/or the thermal expansion coefficients of the substrate and a nitride semiconductor layer/film. The nitride semiconductor layer may be grown as a single crystal by using the nitride semiconductor dots as cores. Although example embodiments are described with respect to nitride semiconductor layers, methods of growing semiconductor layers according to example embodiments may be widely applied to the growth of a material layer on a material layer with different properties (e.g., thermal expansion coefficients and/or lattice constants).

The vertical and horizontal growth speeds of the nitride semiconductor layer may be controlled by, for example, adjusting a ratio of a group III-V semiconductor material and growth temperature. Because the nitride semiconductor dots may be formed and arranged in a first direction, the nitride semiconductor layer may be grown as a single crystal. While the nitride semiconductor layer is growing as the single crystal the nitride semiconductor dots may be connected to each other. During the growth, a stress relaxation layer may be formed between the nitride semiconductor dots and the nitride semiconductor layer. The stress relaxation layer may be continuously grown with the nitride semiconductor layer at the same or substantially the same temperature at which the nitride semiconductor layer is growing. In the stress relaxation layer, dislocations generated on the interfaces between the nitride semiconductor dots and the nitride semiconductor layer may meet and may be reduced. The thickness of the stress relaxation layer may correspond to a stress relaxation thickness at which the nitride semiconductor dots connect to each other.

The nitride semiconductor layer may be grown to a thickness that is greater than or equal to a stress relaxation thickness. As an example, the stress relaxation layer may have a thickness of about 40 μm to about 50 μm, inclusive. The nitride semiconductor layer may be separated from the substrate by using one of commonly known techniques, for example, a laser liftoff method. A freestanding nitride semiconductor substrate may be obtained by the separation. The freestanding nitride semiconductor substrate may include the nitride semiconductor layer and the nitride semiconductor dots, which may be presented at a surface of the nitride semiconductor layer. The stress relaxation layer may exist between the nitride semiconductor layer and the nitride semiconductor dots. In the freestanding nitride semiconductor substrate, the nitride semiconductor dots may be of hexagonal shape and may exist on the surface of the nitride semiconductor layer, which initially interfaced with the substrate (e.g., sapphire substrate), but separated from the substrate.

According to at least some example embodiments, a relatively thick GaN layer may be grown on a sapphire substrate by using, for example, a HVPE method to fabricate a GaN substrate. The sapphire substrate may be used as a heterogeneous substrate for growing the relatively thick GaN layer. Sapphire may have a hexagonal structure similarly to GaN, and may be relatively inexpensive and relatively stable at higher temperatures. Sapphire may generate strain at the interface due to the differences between the lattice constants and the thermal expansion coefficients of GaN and sapphire. The strain may result in lattice defects and/or cracks in the crystal. When a GaN layer is formed on a sapphire substrate cracks may be formed in the GaN layer. According to at least some example embodiments, GaN dots arranged in a first direction may be used to reduce and/or eliminate the possibility of stress induced crack formation. To obtain a relatively thick GaN layer, GaN may be grown from the GaN dots in vertical and horizontal directions. A thickness of the relatively thick GaN layer may be determined based on the average size of the GaN dots.

Figure 2:
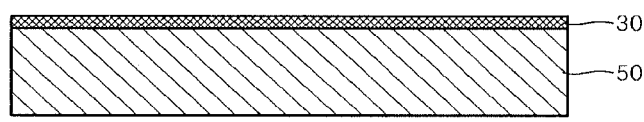
Figure 3:
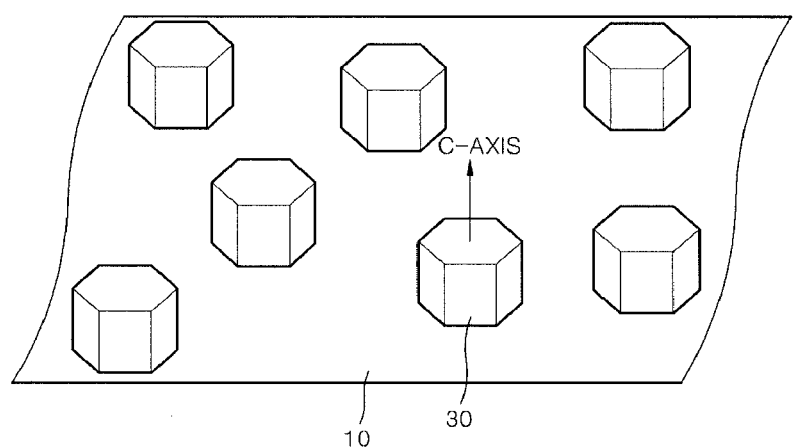

FIG. 1 is a cross-sectional diagram illustrating methods of growing a semiconductor layer on a substrate (10) according to example embodiments. FIG. 2 is a cross-sectional diagram illustrating a freestanding semiconductor substrate obtained by separating a relatively thick semiconductor layer (50) from a substrate (10) in the structure shown in FIG. 1. FIG. 3 is a perspective diagram of dots (30) formed on a substrate. The semiconductor layer may be, for example, a nitride semiconductor layer (e.g., GaN). The substrate (10) may be, for example, a sapphire substrate. The dots (30) may be, for example, nitride dots (e.g., GaN dots).

Referring to FIG. 1, the substrate (10) may be prepared to grow the semiconductor layer 50. As illustrated in FIG. 3, dots (30) (e.g., GaN semiconductor dots) may be formed on the substrate (10). The dots (30) may reduce stress induced cracks generated due to differences between the lattice constants and/or the thermal expansion coefficients of the substrate (10) and the thick semiconductor layer (50). The dots (30) may be represented as a dot layer as shown in FIG. 1. According to one or more example embodiments, in a process to form the dots (30), the substrate (10) may be mounted in an HVPE reactor. A halide may be generated in the reactor. For example, GaCl may be synthesized from hydrogen chloride (HCl) and gallium (Ga) metal at a relatively high temperature. The halide may be processed to form dots (30). For example, GaCl may be processed with ammonia ($NH_3$) to grow GaN dots (30) on a sapphire substrate (10).

According to one or more example embodiments, a surface of the substrate (10) may be treated to remove atoms. Seeds may be formed by substitutionally filling vacancies generated by the removal of the atoms with at least one type of atom included in a material of the plurality of seeds. For example, if the semiconductor is GaN, a sapphire substrate (10) mounted in an HVPE reactor may be processed with HCl+ $NH_3$ to remove oxygen from a surface of the sapphire substrate. Nitride seeds (e.g., nucleation sites) may be formed on the substrate. For example, aluminum nitride (AlN) seeds (not shown) may be formed as seeds on which to grow GaN dots (30) on the surface of a sapphire substrate (10). The HCl and Ga may react with each other to form GaCl, and the GaCl may react with ammonia ($NH_3$). GaN may be grown from the AlN seeds and the GaN dots (30) may be formed on the sapphire substrate (10). The GaN dots (30) may be grown at relatively high temperatures, for example, about 900° C. Referring to FIG. 3, the nitride dots (30) may have hexagonal shapes and may be arranged in a given direction, for example, a c-axis direction. Example embodiments are not limited to the use of seeds and GaN dots (30) may be formed directly on the sapphire substrate (10) without the use of seeds.

According to example embodiments, AlN nano dots may be formed on the sapphire substrate (10) as seeds, and GaN dots (30) may be grown on the AlN nano dots. The AlN nano dots may be part of (e.g., inside) the GaN dots (30). In order to form AlN nano dots on a surface of a sapphire substrate (10), NH3 and HCl may be simultaneously introduced into a chamber. Because the surface of the sapphire ($Al_2O_3$) substrate (10) may include oxygen dangling bonds, some oxygen may be removed by HCl, and the vacancies (originally occupied by the removed oxygen) may be filled by nitrogen thermally decomposed from NH3. AlN nano dots may be randomly formed on the surface of the sapphire substrate (10) according to an oxygen substitution process.

Figure 4A:
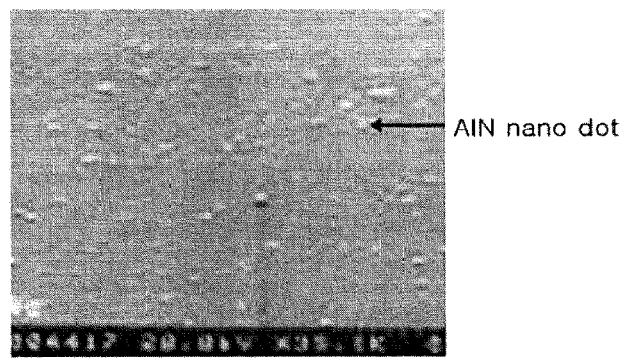
FIG. 4A is a scanning electron microscope (SEM) image of ALN nanodots on a sapphire substrate.

FIG. 4A is a scanning electron microscope (SEM) image of ALN nanodots on a sapphire substrate. Referring to FIG. 4A, the average size of AlN nano dots may be controlled by various parameters including, for example, an amount/(flow ratextime period) of NH3 and HCl and/or a temperature of the sapphire substrate (10). As an example, AlN dots may be formed using a 3000 sccm flow rate of NH3 and a 200 sccm flow rate of HCl, at a sapphire substrate temperature of about 970° C., for about 5 minutes, in a reactor with a diameter of about 15 cm. The AlN nano dots may be randomly/uniformly formed on a sapphire substrate (10). The average size of AlN nano dots may be in the range from about 10 nm to about 100 nm. Sizes and density of AlN nano dots may be determined according to temperature and time period. The average size of GaN dots (30) and a thickness of the GaN layer (50) may be a function of the average size of the ALN nano dots.

Figure 4B:
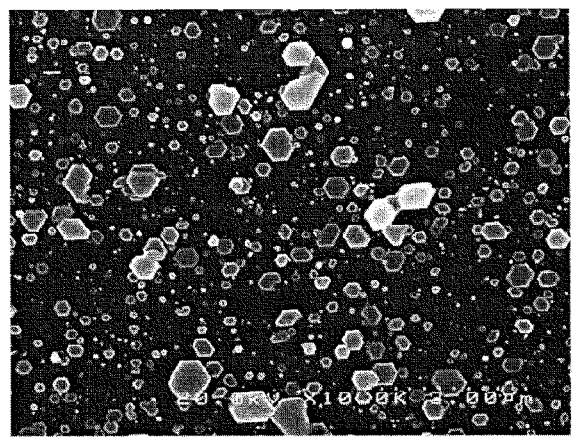
FIGS. 4B and 4C are scanning electron microscope (SEM) images showing GaN dots grown on a sapphire substrate.
Figure 4C:
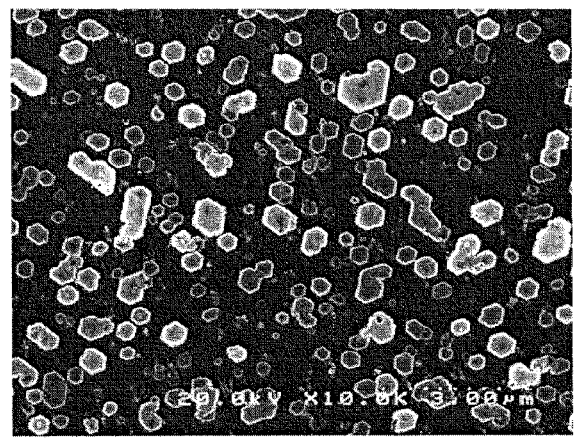

FIGS. 4B and 4C are scanning electron microscope (SEM) images showing GaN dots (30) formed on a sapphire substrate (10). Referring to FIGS. 4B and 4C, the GaN dots (30) may be arranged in a c-axis direction.

The semiconductor layer (50) may be grown on the nitride dots (30). The nitride dots (30) may act as cores and the semiconductor layer (50) may grow from the cores. The growing speeds in vertical and horizontal directions may be controlled by adjusting a ratio of the group III-V semiconductor material and/or the growing temperature. Because the hexagonal nitride dots (30) shown in FIGS. 4B and 4C may be arranged in one direction a semiconductor may be grown as a single crystal.

Figure 5:
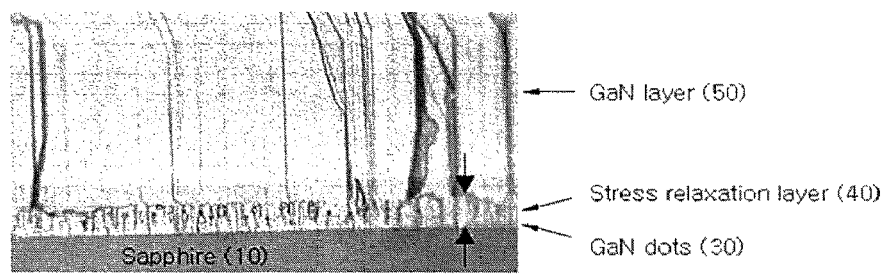

FIG. 5 is an optical microscope image showing a stress buffer layer (40) formed between GaN dots (30) used as cores on a sapphire substrate (10), and a GaN layer (50) on both of the GaN dots (30) and the stress buffer layer (40). FIG. 5 may show that the stress relaxation layer (40) formed between the GaN dots (30) and the GaN layer (50) is formed when the GaN layer (50) is grown on the sapphire substrate by using the GaN dots (30) as cores. The GaN layer (50) may be grown to a thickness that is about greater than or equal to a stress relaxation layer thickness of a stress relaxation layer (40) in which the nitride dots (30) are connected to each other during the growing of the GaN layer (50). The stress relaxation layer (40) may be formed between the GaN dots (30) and the GaN layer (50) during the growing of the GaN layer (50).

The stress relaxation layer (40) may be continuously grown at the same or substantially the same temperature as the GaN layer (50). When the GaN layer (50) is grown on the GaN dots (30) dislocations may be generated at the interfaces of the GaN dots (30). The GaN may be grown from each GaN dot/core (30) and connected to each other at a point at which the dislocations are partially removed and the stress relaxation layer (40) is formed. The stress relaxation layer (40) may be grown from GaN dots (30) formed with/on AlN nano dots formed on a sapphire substrate (10) as seeds. AlN nano dots may be inside the GaN dots. According to example embodiments, the stress relaxation layer (40) may be grown from GaN dots formed directly on the sapphire substrate (10) without employing any seeds and the GaN dots may not include AlN nano dots. The stress relaxation layer (40) may have thickness of about 40 μm to about 50 μm, inclusive, as described above. The thickness of the stress relaxation layer (40) may vary depending on the average size of the GaN dots (30). For example, the thickness of the stress relaxation layer may be from about 1 μm to about 100 μm, inclusive, according to the average size of the dots (30).

When GaN is grown using GaN dots, most of which have a size of about 0.4 μm or greater, a stress relaxation layer thickness (coalescence), according to example embodiments in which the cores contact each other, may be about 40 μm to about 50 μm, inclusive. The thickness of the stress relaxation layer (50) may correspond to the stress relaxation thickness. When the thickness of the GaN layer (50) is about 60 μm to about 70 μm or greater, the GaN layer (50) may have an almost mirror surface and there may be few stress induced cracks. According to example embodiments, there may be no stress induced cracks. When the GaN layer (50) is grown to the stress relaxation thickness or greater, the GaN layer (50)

with few or without cracks and/or defects in the crystal may be obtained with a desired thickness range.

Referring to FIG. 2, a freestanding semiconductor substrate including a semiconductor layer (50) and dots (30) may be obtained by separating the semiconductor layer (50) with a desired thickness from the substrate (10) with, for example, a laser liftoff method. A relatively high-efficient LED may be fabricated on the freestanding semiconductor substrate formed from the nitride dots (30) with few or without stress induced cracks and defects. The freestanding semiconductor substrate may include a surface which was the initial interface with the sapphire substrate (10). The interface may be formed to be an open surface through the separation process. The nitride dots (30) may exist on the surface of the freestanding GaN layer and may have hexagonal shapes. An LED may be formed on a side of the freestanding semiconductor substrate opposite the dots (30). The substrate may include a frontside substrate layer including the semiconductor layer (50) and a backside substrate layer including the dots (30).

In a laser liftoff method, a laser beam having a wavelength shorter than about 360 nm may be used. For example, semiconductor layer (50) may be irradiated by the laser beam to be separated from the substrate (10). The laser light source for performing the laser liftoff may be, for example, a third harmonic generation (about 321 nm) of a Nd:YAG laser with a wavelength of about 1064 nm, a KrF excimer laser having a wavelength of about 248 nm and/or a XeCl excimer laser having a wavelength of about 330 nm. When the laser beam having a wavelength of about 360 nm or shorter is irradiated onto the substrate (10) and the semiconductor layer (50), the interface between the semiconductor layer (50) and the substrate (10) may absorb the laser beam. For example, if the semiconductor layer (50) is GaN and the substrate (10) is sapphire, the GaN at the interface between the semiconductor layer (50) and the sapphire substrate (10) may become $Ga+\frac{1}{2}N_2$, and may cause separation of the GaN layer (50) from the sapphire substrate (10).

A stress relaxation layer is not separately shown in FIGS. 1 and 2 because the stress relaxation layer may be formed during the growing process of the semiconductor layer (50) on the dots (30) up to a desired thickness. The thickness of the stress relaxation layer may vary depending on the average size of the dots (30). According to example embodiments, the stress relaxation layer may not be classified as a separate layer.

According to methods of growing nitride semiconductor layers of at least some example embodiments, a nitride semiconductor may be grown using a HVPE method. When GaN is grown on a sapphire substrate (10) by the HVPE method using GaN dots, the GaN dots (30) may be grown in-situ. Growing GaN on a sapphire substrate (10) with GaN dots (30) may provide a relatively high quality, relatively thick GaN layer (50) with few or without cracks and/or defects generated due to the differences between the lattice constants and the thermal expansion coefficients of the sapphire substrate and the GaN.

Referring to FIGS. 4B and 4C, most of the GaN dots (e.g., about 90% of the GaN dots) may be a size of about 0.4 μm or less. In FIG. 4C, most of the GaN dots (e.g., about 90% of the GaN dots) may be a size of about 0.4 μm to about 0.8 μm, inclusive. The GaN dots with a relatively small average size as shown in FIG. 4B may be formed at a relatively low growing temperature, for example, about 980° C. to about 990° C., inclusive. The GaN dots with a relatively large average size as shown in FIG. 4C may be formed at a relatively high growing temperature, for example, about 1040° C. The temperature for a desired average size of GaN dots may be varied during the growing process at different conditions. An average size of GaN dots may depend upon various factors. In FIGS. 4B and 4C, the GaN dots may be directly formed on the sapphire substrate (10) or may be formed after forming the AlN nano dot seeds as shown FIG. 4A on the sapphire substrate (10).

For GaN dots with an average size, for example, of about 0.4 μm or less (as shown in FIG. 4B), a GaN layer grown using the relatively fine size of GaN dots as the cores may include a mirror-like surface with a thickness of about 10 μm or more. With the relatively fine size of GaN dots, the relatively thin GaN layer having a thickness of about 10 μm may be obtained. When the GaN dots are of an average size, for example, of about 0.4 μm or more (e.g., about 0.4 μm to about 0.8 μm, inclusive), a GaN layer grown using the relatively coarse size of GaN dots as the cores may be grown up to a relatively large thickness (e.g., about 100 μm to about 1000 μm). This relatively thick GaN layer may be used, for example, as a freestanding GaN substrate for fabricating high and/or improved efficiency LEDs.

According to methods of growing nitride semiconductor layers according to one or more example embodiments, a GaN layer may be grown to a thickness of about 300 μm or more (e.g., about 300 μm to about 400 μm, inclusive). When the GaN layer is grown using a relatively coarse average size of GaN dots (e.g., about 0.4 μm to about 0.8 μm, inclusive), the GaN layer may have a thick thickness of about 300 μm or more. This relatively thick GaN layer may be separated from the sapphire substrate, and a freestanding GaN substrate with a sufficient thickness to be a substrate may be obtained and used for fabricating a device thereon. The GaN layer may be grown to be relatively thin (e.g., a thickness of about 300 μm or less) without creating stress induced cracks and/or defects. A high and/or improved quality GaN layer, as well as a freestanding GaN substrate, with about any desired thickness may be obtained using the GaN dots according to methods of growing semiconductor layers according to example embodiments.

When the GaN layer is grown by using the relatively coarse average size of GaN dots (e.g., about 0.4 μm or more) as the cores, the stress relaxation thickness (coalescence), in which the cores are connected to each other, may be about 40 μm to about 50 μm, inclusive. When the GaN layer is grown using the relatively coarse average size of GaN dots as the cores, the GaN layer may change into a mirror-like status without forming cracks at a relatively low thickness (e.g., about 60 μm to about 70 μm, inclusive). When the thickness of the GaN layer is greater than or equal to a thickness of the stress relaxation layer (coalescence) at a given average size of the GaN dots, a relatively high quality GaN layer without cracks and/or defects may be obtained.

Figure 6:
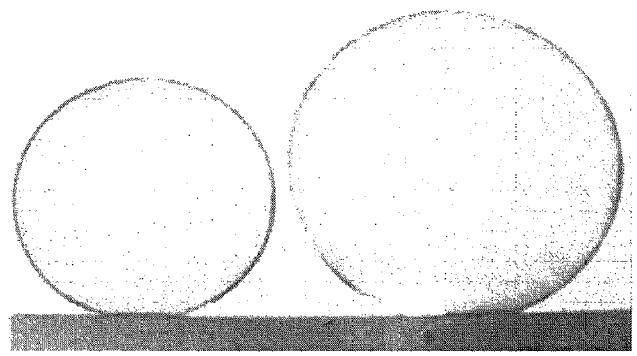

FIG. 6 is an optical image showing thick GaN/sapphire layers grown according to example embodiments with diameters of about 3 inches and about 4 inches. The GaN/sapphire structures are grown by using GaN dots according to methods of growing semiconductor layers of example embodiments. Referring to FIG. 6, the GaN layer may have little or no cracks.

While example embodiments are particularly shown and described, it will be understood by one of ordinary skill in the art that variations in form and detail may be made therein without departing from the spirit and scope of the claims. For example, although methods of growing nitride semiconductor layers according to example embodiments is described above with respect to GaN layer growth on a sapphire substrate, such should be considered in a descriptive sense only and not for purposes of limitation. It should be apparent that modifications and variations thereto are possible, all of which fall within the true spirit and scope of example embodiments. It is to be realized that optimum relationships for components and steps, including variations in order, form, content, function, manner of operation and method of fabrication, are deemed readily apparent and obvious to one skilled in the art, and all equivalent relationships to those illustrated in the drawings and described in the specification are intended to be encompassed. The above description and drawings are illustrative of modifications that can be made without departing from the scope of this disclosure, the scope of which is to be limited only by the following claims.

Therefore, the foregoing is considered as illustrative only of the principles of example embodiments. Further, because numerous modifications and changes will be made by those skilled in the art, it is not desired to limit example embodiments to the exact construction and operation shown and described, and accordingly, all suitable modifications and equivalent are intended to fall within the scope of the claims.

What is claimed is:

1. A nitride semiconductor substrate, comprising:
a plurality of seeds formed of a first nitride semiconductor;
a plurality of nitride semiconductor dots on the plurality of seeds, the plurality of nitride semiconductor dots having an average size of less than or equal to about 0.8 μm, the nitride semiconductor dots including a second nitride semiconductor that is a different type of material than a material of the first nitride semiconductor; and
a nitride semiconductor layer on the nitride semiconductor dots, wherein
the plurality of seeds are spaced apart from each other,
the first nitride semiconductor is AlN,
the second nitride semiconductor is GaN,
an average size of the seeds is in a range from about 10 nm to about 100 nm,
an average size of two or more of the nitride semiconductor dots is about 0.4 μm to about 0.8 μm, and
the nitride semiconductor layer is formed of GaN.

2. The nitride semiconductor substrate of claim 1, further comprising:
a stress relaxation layer, the nitride semiconductor dots connected to each other by the stress relaxation layer.

3. The nitride semiconductor substrate of claim 2, wherein a thickness of the nitride semiconductor layer is greater than or equal to a thickness of the stress relaxation layer.

4. The nitride semiconductor substrate of claim 2, wherein a thickness of the stress relaxation layer is about 1 μm to about 100 μm.

5. The nitride semiconductor substrate of claim 1, wherein the nitride semiconductor dots are arranged in a first direction on a surface of the nitride semiconductor layer.

6. The nitride semiconductor substrate of claim 1, wherein a thickness of the nitride semiconductor layer is about 100 μm to about 1000 μm.

7. The nitride semiconductor substrate of claim 1, wherein a thickness of the nitride semiconductor layer is about 10 μm.

8. The nitride semiconductor substrate of claim 1, wherein a shape of the semiconductor dots is hexagonal on a surface of the nitride semiconductor layer.

9. A nitride semiconductor substrate, comprising:
a seed layer including a plurality of AlN seeds the plurality of seeds being spaced apart from each other, an average size of the seeds being in a range of about 10 nm to about 100 nm;
a plurality of nitride semiconductor dots on the seed layer, the plurality of nitride semiconductor dots having an average size of less than or equal to about 0.8 μm, the nitride semiconductor dots being formed of GaN; and
a nitride semiconductor layer on the nitride semiconductor dots, the nitride semiconductor layer being formed of GaN.

10. A nitride semiconductor substrate, comprising:
a plurality of nitride semiconductor dots,
the plurality of nitride semiconductor dots having an average size of less than or equal to about 0.8 μm,
the nitride semiconductor dots including first parts formed of AlN and second parts formed of GaN, the first parts being spaced apart from each other; and
a nitride semiconductor layer on the nitride semiconductor dots, the nitride semiconductor layer being formed of GaN.

11. The nitride semiconductor structure of claim 9, wherein
the seed layer is on a first layer,
the first layer includes a first material, and
the first material is sapphire.

12. The nitride semiconductor structure of claim 1, further comprising:
a stress relaxation layer between the nitride semiconductor dots and the nitride semiconductor layer, wherein
the nitride semiconductor dots are connected to each other by the stress relaxation layer,
a thickness of the stress relaxation layer is in a range from about 1 μm to about 100 μm,
the stress relaxation layer is formed of GaN, and
the nitride semiconductor layer has fewer cracks compared to the stress relaxation layer.

13. The nitride semiconductor structure of claim 9, further comprising:
a stress relaxation layer on the plurality of nitride semiconductor dots, wherein
the nitride semiconductor layer is on the stress relaxation layer,
a thickness of the stress relaxation layer is in a range of about 1 μm to about 100 μm,
the stress relaxation layer connects the nitride semiconductor dots to each other,
the stress relaxation layer is formed of GaN, and
the nitride semiconductor layer has fewer cracks compared to the stress relaxation layer.

14. The nitride semiconductor structure of claim 10, further comprising:
a stress relaxation layer on the nitride semiconductor dots, wherein
the stress relaxation layer is formed of GaN,
the stress relaxation layer connects the nitride semiconductor dots to each other, and
a thickness of the stress relaxation layer is in a range from about 1 μm to about 100 μm.

* * * * *